United States Patent [19]

Brown

[11] Patent Number: 5,261,599
[45] Date of Patent: Nov. 16, 1993

[54] RAIL PADS

[75] Inventor: Trevor P. Brown, Kent, United Kingdom

[73] Assignee: Pandrol Limited, Weybridge, United Kingdom

[21] Appl. No.: 857,370

[22] Filed: Mar. 24, 1992

Related U.S. Application Data

[63] Continuation-in-part of Ser. No. 610,957, Nov. 8, 1990, abandoned.

[30] Foreign Application Priority Data

Nov. 8, 1989 [GB] United Kingdom ............... 8925238

[51] Int. Cl.⁵ .............................................. E01B 9/68
[52] U.S. Cl. .................................. 238/283; 238/382
[58] Field of Search ............... 238/107, 264, 283, 306, 238/382

[56] References Cited

U.S. PATENT DOCUMENTS

| 1,659,844 | 2/1928 | Tupper | 238/283 |
|---|---|---|---|
| 2,076,019 | 4/1937 | Fifield | 238/283 |
| 2,817,009 | 12/1957 | Field | 238/283 |
| 3,432,098 | 3/1969 | Sato | 238/283 |
| 3,784,097 | 1/1974 | Landis | 238/283 X |
| 4,047,663 | 9/1977 | Reynolds et al. | 238/283 X |
| 4,208,011 | 6/1980 | Dahlhaus et al. | 238/283 X |
| 4,216,904 | 8/1980 | Vivion | 238/283 X |
| 4,235,371 | 11/1980 | Kohler | 238/382 |
| 4,326,670 | 4/1982 | Sherrick et al. | 238/283 X |
| 4,527,736 | 7/1985 | Ortwein | 238/382 X |
| 4,618,093 | 10/1986 | Young et al. | 238/283 |
| 4,648,554 | 3/1987 | McQueen | 238/382 X |
| 4,775,103 | 10/1988 | Ortwein | 238/283 |
| 4,907,740 | 3/1990 | Oberweiler et al. | 238/283 |
| 5,165,598 | 11/1992 | Ortwein | 238/283 |

FOREIGN PATENT DOCUMENTS

| 2630466 | 10/1989 | France | 238/283 |
|---|---|---|---|
| 390000 | 9/1968 | Switzerland | 238/283 |
| 1542766 | 6/1977 | United Kingdom | . |
| 2051187 | 1/1981 | United Kingdom | . |
| 2114635 | 8/1983 | United Kingdom | . |
| 2121461 | 12/1983 | United Kingdom | . |

Primary Examiner—Michael S. Huppert
Assistant Examiner—Scott L. Lowe
Attorney, Agent, or Firm—Norbert P. Holler

[57] ABSTRACT

A pad, suitable for spacing the bottom of a railway rail from a rail foundation on which the rail stands, comprises a plate-like rail-supporting portion (1), made of cushioning material, having an upper main face supporting the rail and softer, resiliently-deformable, sealing portion (3) located at a peripheral region of the lower main face of the rail-supporting portion (1). When the pad is placed on a rail foundation and a rail is placed on the upper main face of the rail-supporting portion (1), the sealing portion (3) deforms under the weight of the rail so as to form a substantially watertight seal, between the rail foundation and the pad, around the periphery of the pad.

22 Claims, 6 Drawing Sheets

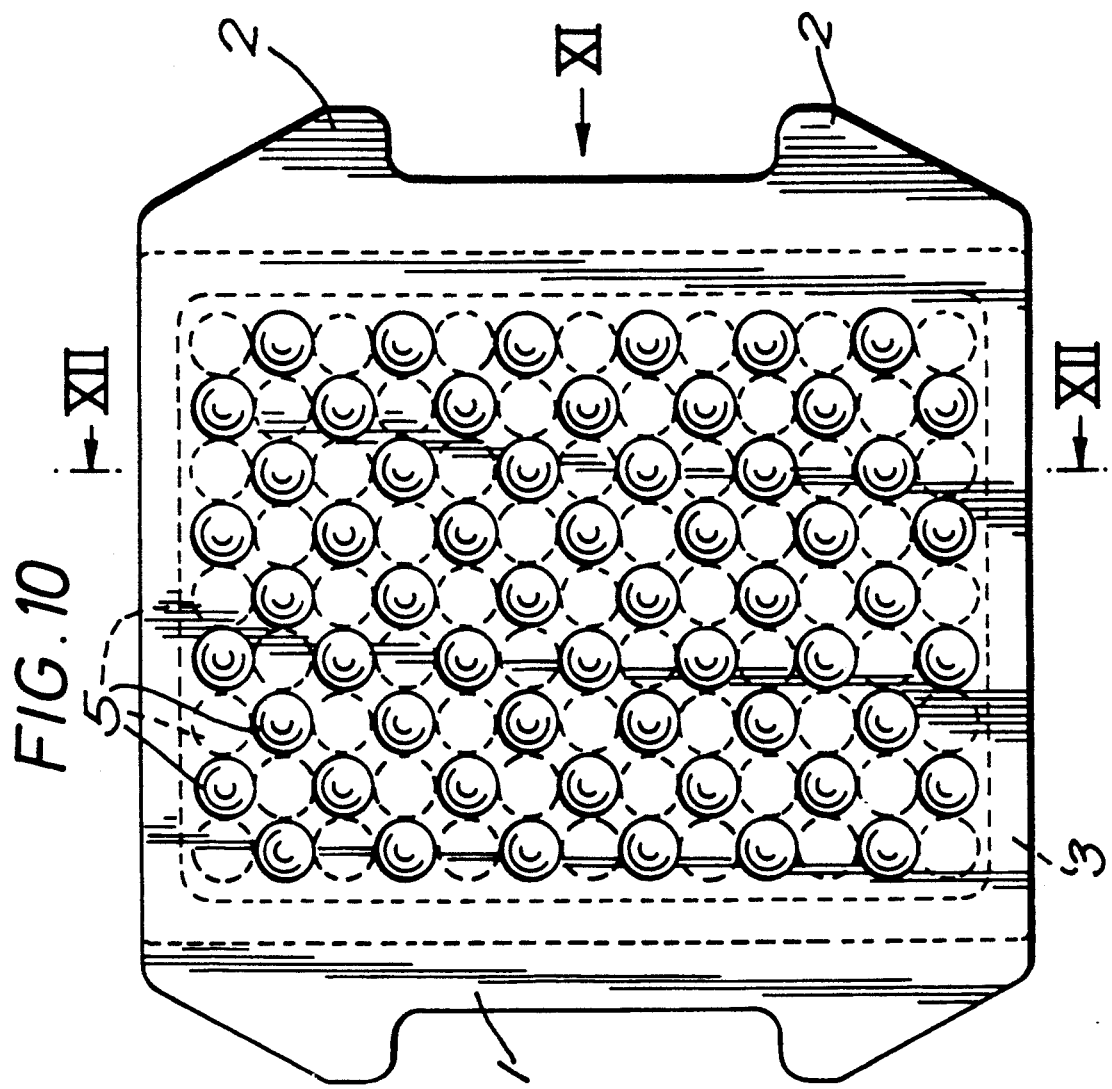
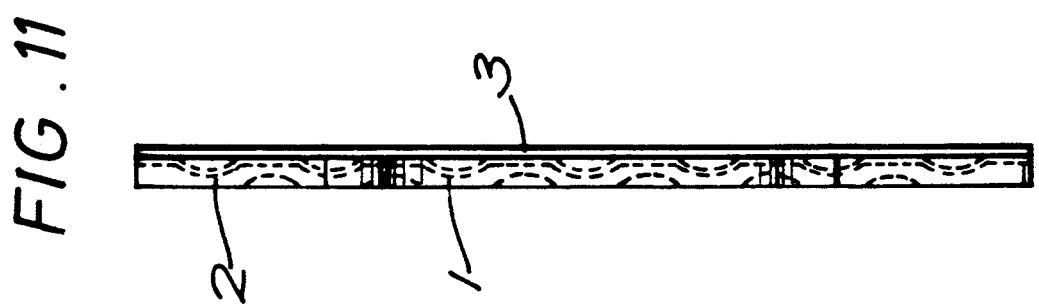

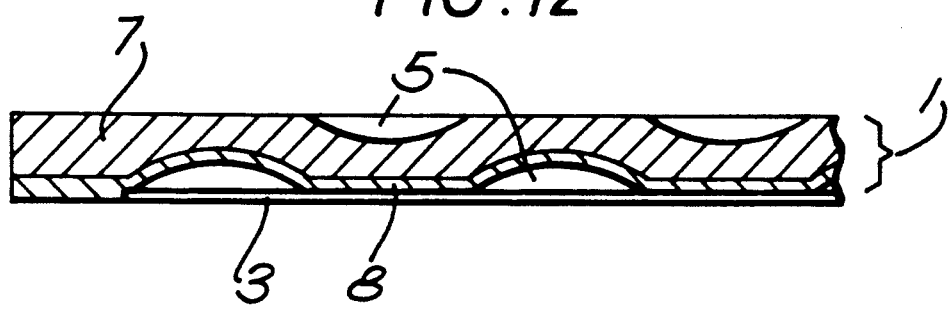
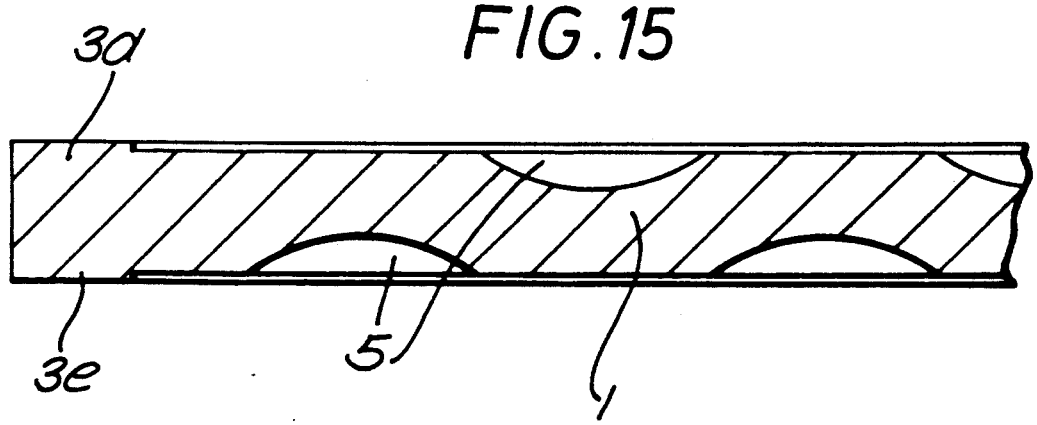

RAIL PADS

The present invention is a continuation-in-part of prior application Ser. No. 610,957 filed on Nov. 8, 1990, and now abandoned.

BACKGROUND OF THE INVENTION

1. Field of the Invention

The present invention relates to a pad suitable for providing cushioning between the bottom of a railway rail and a rail foundation on which the rail stands.

2. Description of the Prior Art

A pad for providing cushioning between the bottom of a railway rail and a rail foundation on which the rail stands should desirably be made of a material which is durable and yet capable of deforming under load sufficiently to damp vibrations of the rail which would otherwise be transmitted deleteriously to the rail foundation. It is difficult in practice to reconcile these durability and vibration-damping requirements, particularly for heavy track conditions.

It has been found that, owing to the seepage of water, bearing particles of grit, sand, etc., between the pad and the rail foundation (commonly a concrete sleeper), erosion of the rail foundation and/or the pad can occur as the pad moves with respect to the surface of the rail foundation, owing to the passage of railway vehicles along the rail above it. Such erosion can be a particular problem where sand is applied to the rail to improve the grip of the wheels of a railway vehicle upon the rail.

BRIEF SUMMARY OF THE INVENTION

According to the present invention, there is provided a pad, for providing cushioning between the bottom of a railway rail and a rail foundation on which said rail stands, the pad comprising a plate-like rail-supporting portion composed of cushioning material and having an upper main face for supporting the rail and also comprising resiliently-supporting deformable sealing means, softer than that upper main face and located at a peripheral region of the lower main face of the rail-supporting portion so as to project from that face. The sealing means are such that, when the pad is placed on the rail foundation and the rail is placed on the upper main face of the rail-supporting portion, those sealing means contact said rail foundation and deform under the weight of the rail to form a substantially watertight seal, between the rail foundation and the pad, around the periphery thereof.

With such a pad, water carrying sand, grit, or other particles, can be prevented from seeping between the base of the pad and the rail foundation, thereby substantially avoiding the problem of erosion of the rail foundation and/or the pad which might otherwise be caused through such water seepage.

Preferably, the rail-supporting portion comprises respective first and second layers having respective first main faces bonded to each other and further having respective free second main faces, said layers providing at their free main faces the upper and lower main faces respectively of the rail-supporting portion, the material of the first layer being harder than the material of the second layer. In such a case the sealing means advantageously comprise a strip formed integrally with the second layer at said peripheral region of the lower main face of the rail-supporting portion. A pad of such construction can be manufactured simply, preferably by moulding, and can provide acceptable durability/vibration-damping characteristics in heavy track conditions.

The first and second layers are preferably made of polyurethane materials of different respective hardnesses, but can also be made of rubber materials of different respective hardnesses. The hardness of the first layer is preferably in the range from 70 to 90 durometer hardness. In a preferred embodiment the hardness of the first layer is 80 durometer hardness and the hardness of the second layer is 60 durometer hardness.

Alternatively, when the rail-supporting portion has a layer structure the sealing means can comprise a strip bonded to said second layer at said peripheral region of the lower main face of the rail-supporting portion, in which case the strip is preferably made of a material that is softer than the material of the second layer.

In some circumstances it may be preferable that the sealing means, when deformed, do not extend beyond the periphery of the rail-supporting portion, so that wearing of the sealing means by rail shoulders, rail clips, etc., can be avoided.

In other embodiments in which the rail-supporting portion is made up of a single material, the sealing means can comprise a layer of resilient material extending (when not deformed), at least substantially, over the entire lower main face of the said rail-supporting portion and preferably extending right up to (but desirably not beyond, except when deformed) the edges of the pad, but can also comprise a strip of resilient material extending around the peripheral region of the lower main face of the rail-supporting portion. Advantageously, the sealing means may be partially located within a recess provided in the lower main face of the rail-supporting portion.

Preferably, the rail supporting portion is composed of hard polyurethane and the sealing means are composed of soft polyurethane. In a preferred embodiment, the polyurethane of the rail supporting portion has a Shore 'A' hardness value of 90 and that of the sealing means a Shore 'A' hardness value of 60.

In another preferred embodiment the rail-supporting portion is rectangular in shape and has respective additional ear portions, projecting from a pair of opposite edges thereof near to the corners of said rail-supporting portion, said ear portions each being substantially triangular in shape and having surface regions projecting outwardly from said opposite edges, which regions define respective recesses, along said opposite edges between said ear portions According to another aspect of the present invention there is provided a pad, for providing cushioning between the bottom of a railway rail and a rail foundation on which the rail stands, the pad comprising a plate-like rail supporting portion having an upper main face for supporting said rail and a lower face contoured to define, at a peripheral region of that face, a sealing strip which, when the pad is placed on the rail foundation and the rail is placed on the upper main face of the rail-supporting portion, contacts the rail foundation and deforms under the weight of the rail to form a substantially watertight seal, between the rail foundation and the pad, around the periphery thereof.

Such a pad is simple and economic to manufacture and can provide acceptable durability/vibration-damping characteristics in certain track conditions.

Preferably, the pad is formed in one piece from polyurethane material of 65 durometer hardness, but can alternatively be formed in one piece from rubber material. The rubber material can be reinforced with canvas.

The upper main face can also be contoured to define a further sealing strip at a peripheral region of that face.

BRIEF DESCRIPTION OF THE DRAWINGS

FIG. 10 shows a plan view from above of a seventh pad embodying the present invention, when the pad is not under load;

FIG. 11 shows a side view of the pad of FIG. 10 as seen in the direction of the arrow XI in FIG. 10;

FIG. 12 shows a partial sectional view of the pad of FIG. 10, taken along the line XII—XII in FIG. 10;

FIG. 15 shows a partial sectional view of the pad of FIG. 13, taken along the line XV—XV in FIG. 13.

DETAILED DESCRIPTION OF THE PREFERRED EMBODIMENTS

A pad embodying the present invention includes a plate-like rail supporting portion (first portion) 1, which may for example be composed of rubber or, for heavier duty conditions, hard polyurethane. Alternatively, the rail supporting portion may be composed of two or more materials of different hardnesses, for example to provide a hard upper surface for contacting the rail and a softer lower region for deforming under the weight of the rail to provide a degree of cushioning. In some circumstances, it may be desirable to provide some form of surface configuration (shown, for example, in FIGS. 10 and 13) on the upper and/or lower face of the rail-supporting portion 1 to enhance the deformability of the pad under load.

Figure 1:
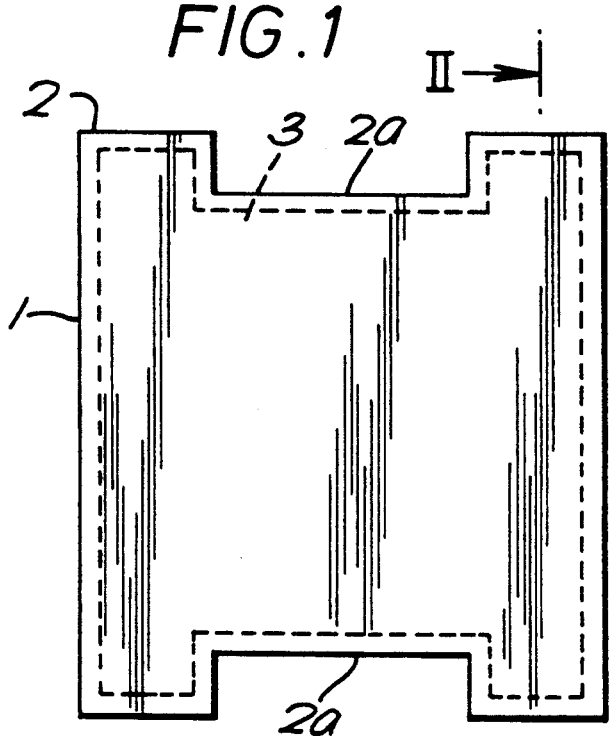
FIG. 1 shows a plan view from above of a first pad embodying the present invention, when the pad is not under load.
Figure 6:
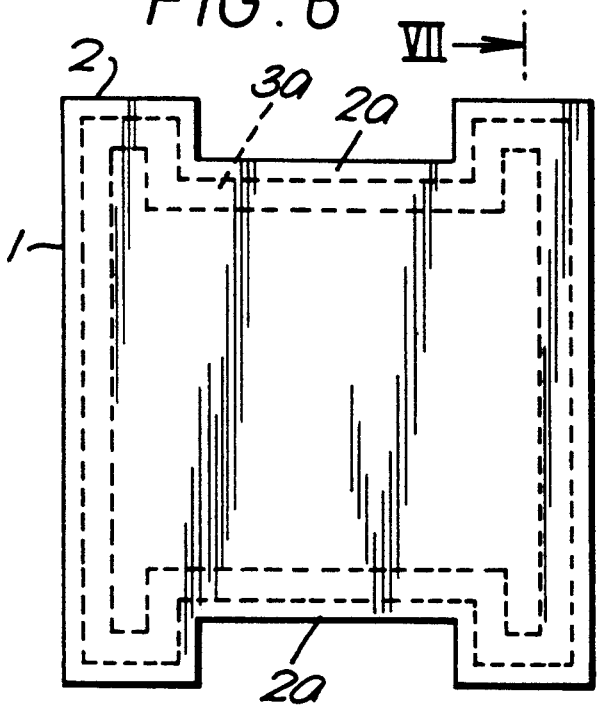
FIG. 6 shows a plan view from above of a third pad embodying the present invention, when the pad is not under load.
Figure 3:
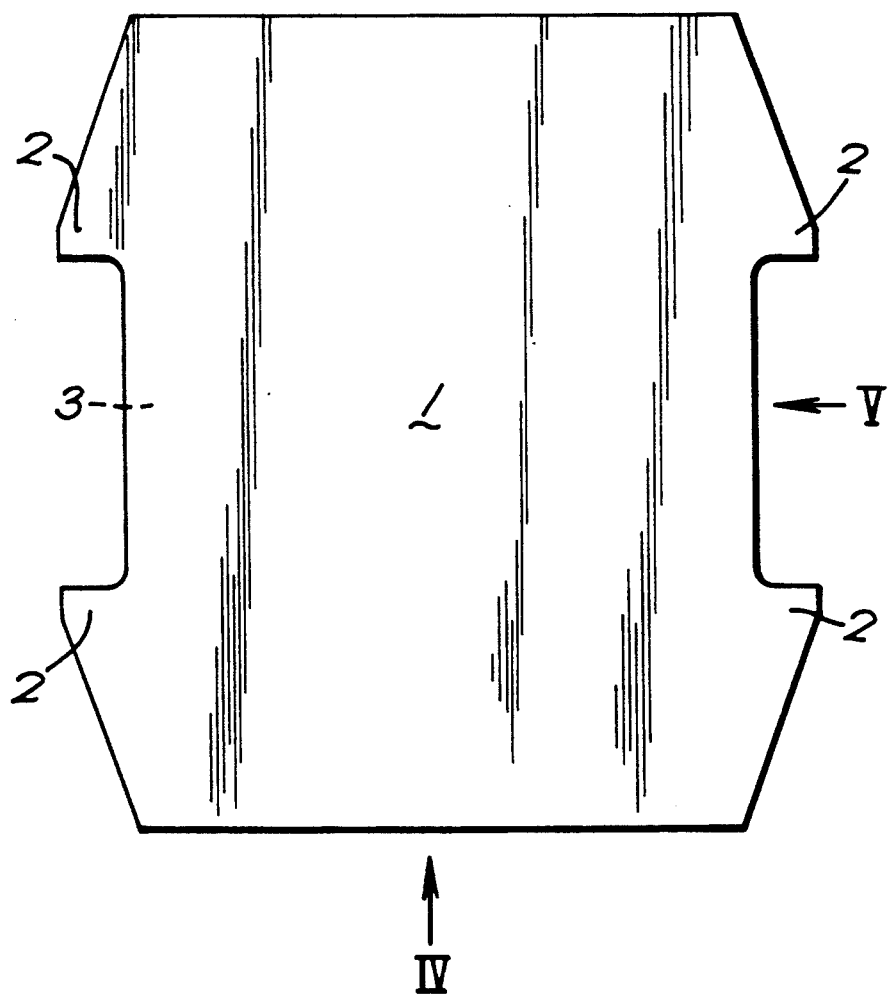
FIG. 3 shows a plan view from above of a second pad embodying the present invention, when the pad is not under load.

In plan, the rail-supporting portion 1 of the pad of FIGS. 1 and 6 is in the form of a rectangle having additional ear portions 2 projecting from each corner thereof, so as to provide, on two opposing sides of the pad, respective recesses 2a for locating the pad when it is in use. In the pad of FIG. 3, the ear portions 2 taper back from the recesses 2a to reduce the material content. In particular, the pad shown in FIGS. 3 to 5, which is suitable for a rail of base width 5.5 inches (14.97 cm), is of width 6.125 inches (15.56 cm) between the recesses 2a, and is 5.75 inches (14.61 cm) in width at the opposing ends of the pad not having the recesses 2a, the pad being of length 7 inches (17.78 cm). That is, the part of the rail-supporting portion 1 where the rail will sit is substantially in the form of a rectangle from which the corners have been cut away. The recesses 2a are of depth 0.625 inches (1.59 cm), so the width of the pad at its widest parts, that is between the most distant extremities of opposing ear portions, is also 7 inches (17.78 cm). The recesses 2a are of length 3.189 inches (8.1 cm). Please note, however, that the precise shape of the rail-supporting portion 1 is not essential to the present invention, and may take other forms.

To provide a seal between the pad and the rail foundation (sleeper) a pad embodying the present invention also includes resiliently-deformable sealing means. These sealing means can be bonded to the lower surface of the rail-supporting portion 1 at least at a peripheral region thereof. In such a case the sealing means are designed to be softer than the rail-supporting portion and can advantageously be composed of soft polyurethane, but may be made of any other suitable resiliently-deformable material, such as rubber for example. Alternatively, when the rail supporting portion comprises two or more layers the sealing means can be formed integrally with the lowermost layer of the rail supporting portion 1 to avoid a separate bonding step for connecting the sealing means to the rail supporting portion.

In the preferred embodiments shown in FIGS. 1 and 2 and FIGS. 3 to 5, the sealing means (second portion) comprise a plate-like sealing layer 3, which layer extends over the lower surface of the rail-supporting portion 1. When the pad is in use, between a rail and a rail foundation, the weight of the rail presses down upon the rail-supporting portion 1 of the pad, which in turn brings about deformation of the sealing layer 3, which thereby forms a substantially watertight seal around the peripheral region of the rail-supporting portion 1. The rail-supporting portion may have a thickness of 4 mm or above, preferably 5 mm, and the sealing layer 3 is desirably, for practical reasons, no less than 1.5 mm thick.

Figure 2:
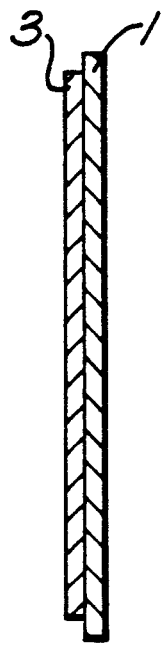
FIG. 2 shows a cross-sectional side view taken along the line II—II in FIG. 1.

In FIGS. 1 and 2 the sealing layer 3 is of the same shape, in plan, as the rail-supporting portion 1, but is slightly smaller in size such that there is a small gap between the edge of the sealing layer 3 and the periphery of the rail-supporting portion 1. This gap is such that, when the sealing layer 3 is deformed under the weight of a rail, the sealing layer 3 does not extend beyond the periphery of the rail-supporting portion 1, thereby protecting the sealing layer 3, made of soft material, from erosion by external elements bearing upon the pad.

Figure 4:
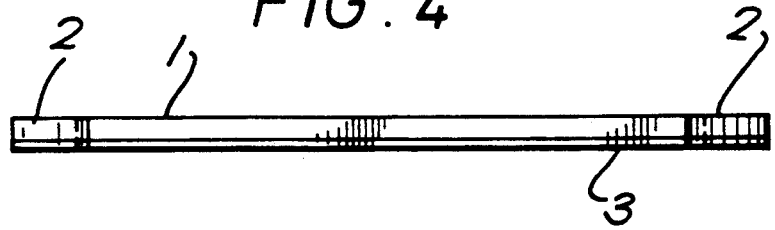
FIG. 4 shows a front elevational view looking in the direction of the arrow IV in FIG. 3.
Figure 5:
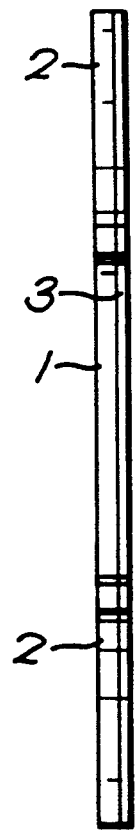
FIG. 5 shows a side view looking in the direction of the arrow V in FIG. 3.

In FIGS. 3 to 5, however, the sealing layer 3 extends over the entire undersurface of the rail-supporting portion 1, i.e. it terminates in line with the edges of that portion when the pad is not under load. This arrangement has the advantage, over the arrangement of FIGS. 1 and 2, that it is better at preventing seepage of water between the pad and the rail foundation, and is also easier to manufacture. Furthermore, the greater the area of the underside of the rail-supporting portion 1 that is covered by the sealing material, the less pressure there will be on that sealing material from the load applied to the pad by the rail clips and rail traffic. Thus, the life of the sealing material is likely to be longer if it extends over the entire under surface of the rail-supporting portion 1, even though, when deformed, the sealing material will extend beyond the periphery of the rail-supporting portion 1.

Figure 7:
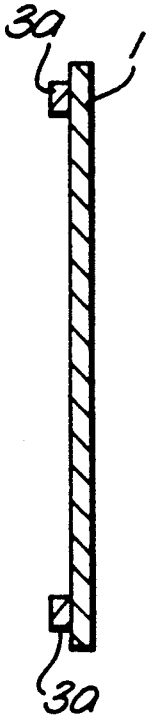
FIG. 7 shows a cross-sectional side view taken along the line VII—VII in FIG. 6.

The pad illustrated in FIGS. 6 and 7 differs from the pad described with reference to FIGS. 1 and 2 only in regard to the sealing means. In the pad of FIGS. 6 and 7 the sealing means are constituted by a sealing strip 3a, of any suitable resiliently-deformable material which is softer than the material of the rail-supporting portion 1, bonded to the lower surface of the rail-supporting portion 1. The sealing strip 3a extends along the edge of the rail-supporting portion 1, preferably at a short distance therefrom for the same reasons as discussed above with reference to FIGS. 1 and 2.

Figure 8:
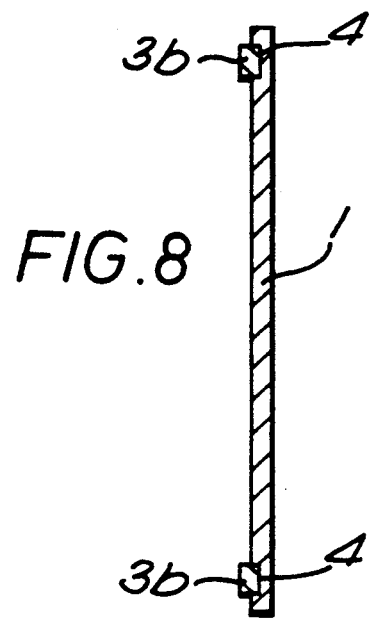
FIGS. 8 and 9 show respective cross-sectional side views of fifth and sixth pads embodying the present invention, when the pads are not under load.
Figure 9:
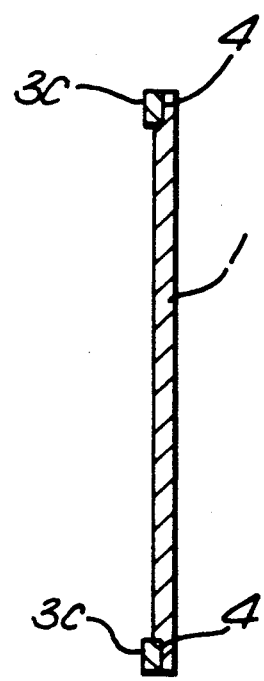

Modifications of the pad shown in FIGS. 6 and 7 are shown in FIGS. 8 and 9. In FIG. 8 the sealing means comprise a sealing strip 3b which is located partially within a recess 4 formed in the lower surface of the rail-supporting portion 1, thus enabling the lower surface of the rail-supporting portion 1 to contact the rail foundation when the pad is in position beneath the rail. FIG. 9 illustrates a pad in which the sealing means, comprising a sealing strip 3c partially located in a recess 4, are not spaced from the edge of the rail-supporting portion 1.

It may be desirable, in some circumstances, to seat the sealing layer 3 of FIGS. 1 and 2 in a recess formed in the underside of the rail-supporting portion 1.

In each of the pads shown in FIGS. 8 and 9, the sealing means are bonded to the rail-supporting portion 1.

In each of the pads described with reference to FIGS. 1 to 9, the sealing means may be bonded to the rail-supporting portion 1 at the time of manufacturing the rail-supporting portion 1 and sealing means, for example by injecting the hard and soft materials simultaneously into a single mould, or may alternatively be bonded to the rail-supporting portion 1 at a later stage of manufacture of the pad, for example by means of an adhesive.

FIGS. 10 to 12 show a further pad embodying the invention, in which the rail supporting portion 1 has a layer structure and the sealing means are formed integrally with the lowermost layer of the rail supporting portion.

The rail supporting portion 1 of the pad of FIGS. 10 to 12 is generally identical in external form to the pad of FIGS. 3 to 5 (its dimensions may be, for example, length 180 mm, maximum width 192 mm and thickness 5.5 mm), but the upper and lower main faces of the rail supporting portion 1 are formed with circular surface indentations 5 to enhance the deformability of the pad under load. The diameter of the indentations may be 12.12 mm and their pitch may be 12.5 mm. The maximum depth of the indentations 5 may be 2 mm. The indentations 5 on the upper and lower faces of the rail supporting portion are offset from one another so that they do not overlap.

As shown in FIG. 12, the rail supporting portion 1 differs from the corresponding portions used in preceding embodiments in that it is composed of two layers 7,8 made of materials of different respective hardnesses. For example, the upper and lower layers 7,8 may both be made of polyurethane materials and the upper layer 7 may be of thickness 4.5 mm and 80 durometer hardness, while the lower layer 8 may be of thickness 1 mm and 60 durometer hardness. Rubber materials of different hardnesses can also be used to form the two layers 7,8. Generally, the thickness of the upper layer 7 should be greater than or equal to the thickness of the lower layer 8, and the upper layer 7 should be harder than the lower layer 8 so that the upper layer presents a relatively hard surface to the rail. The hardness of the upper layer may be as high as 90 durometer hardness.

The lower layer 8 is bonded to the upper layer 7 over the entire lower face thereof, including the indentations 5.

The free face of the lower layer 8 is contoured to provide a generally-rectangular sealing strip 3 of width 8 mm and thickness 0.6 mm at a peripheral region of that face.

In the pad of FIGS. 10 to 12 the two layers of different hardnesses permit the pad to provide a hard support surface for the rail and a softer deformable surface for preventing ingress of water and abrasive materials between the pad and the rail foundation. The formation of the sealing strip 3 and lower layer 2 in one piece can facilitate reductions in manufacturing cost.

In the pad described with reference to FIGS. 10 to 12, the lower layer 8 may be bonded to the upper layer 7 at the time of manufacturing the rail-supporting portion 1, for example by injecting the hard and soft materials simultaneously into a single mould, or may alternatively be bonded to the rail-supporting portion 1 at a later stage of manufacture of the pad, for example by means of an adhesive.

The sealing means 3 in the pad of FIGS. 10 to 12 can alternatively be a separate item bonded to the free face of the lower layer after formation of the rail supporting portion. In such a case the sealing strip can be made of softer material than both the upper and lower layers of the rail supporting portion.

Figure 13:
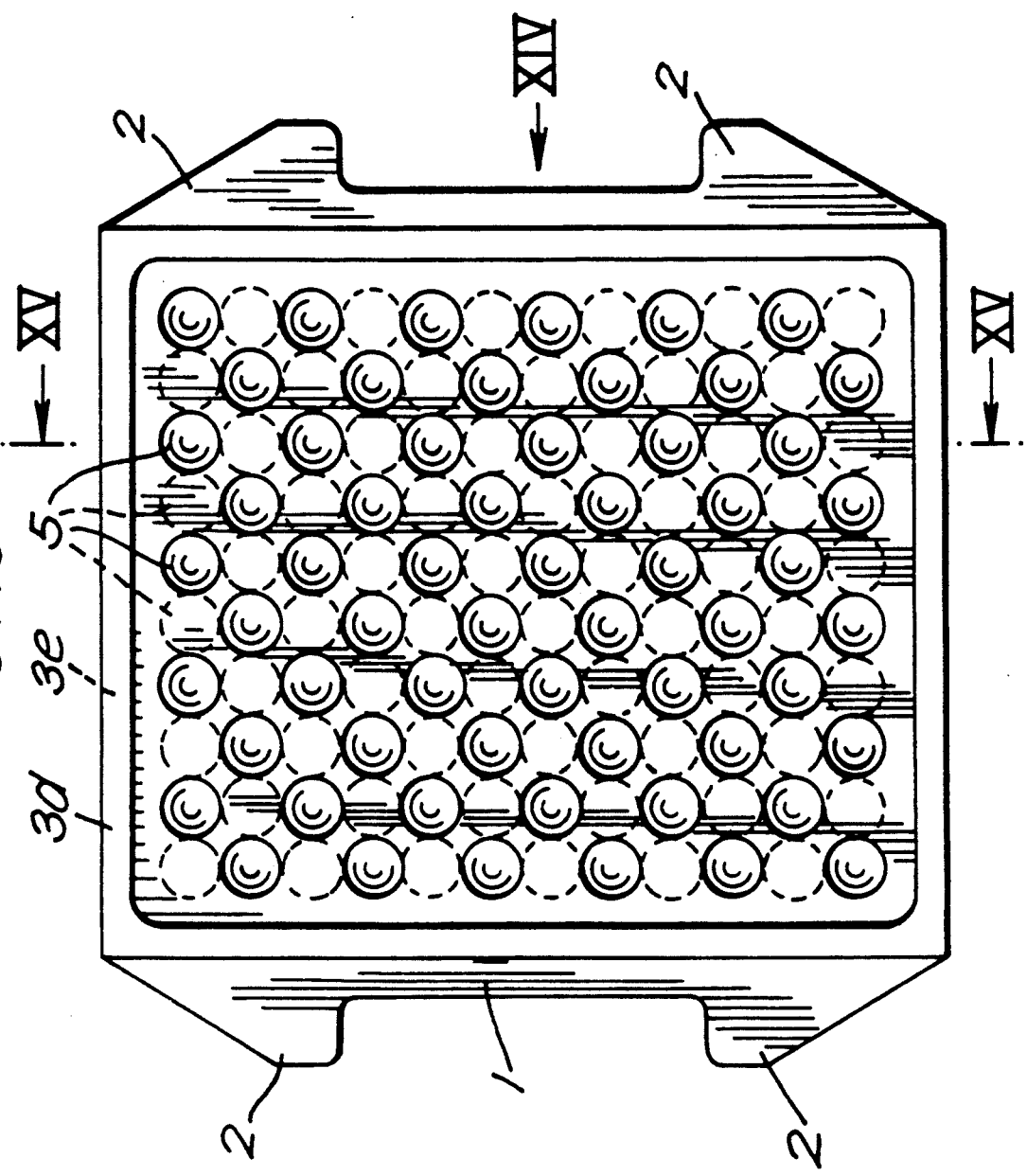
FIG. 13 shows a plan view from above of an eighth pad embodying the present invention, when the pad is not under load.
Figure 14:
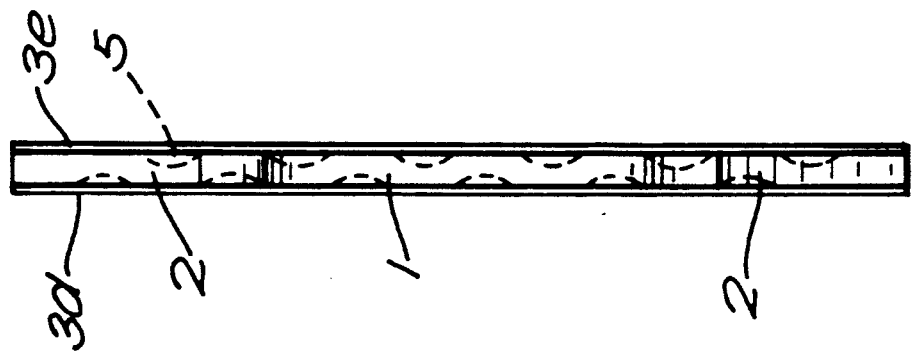
FIG. 14 shows a side view of the pad of FIG. 13 as seen in the direction of the arrow XIV in FIG. 13.

A further pad is shown in FIGS. 13 to 15, in which the sealing means are formed integrally with the rail supporting portion to avoid the use of two materials as in the pads described hereinbefore with reference to FIGS. 1 to 12.

The pad of FIG. 13 has a rail supporting portion 1 of similar surface configuration to the pad of FIG. 10, but is made of a single material, for example polyurethane of durometer 65. Alternatively, rubber, possibly reinforced with canvas to provide extra strength, can be used to form the pad of FIGS. 13 to 15.

The rail supporting portion 1 may be 178 mm in length, 197 mm in maximum width and 6.5 mm in thickness and has ears 2 at its four corners. The surface indentations 5 on the upper and lower faces of the rail supporting portion 1 are of substantially identical dimensions of the indentations in the pad of FIG. 10.

At its upper and lower main faces the rail supporting portion has upper and lower sealing rings 3d,3e, of width 6.35 mm and thickness 0.6 mm, that extend around the peripheries of those faces. The overall thickness of the pad, taking into account the sealing rings 3d,3e, is 7.72 mm when the pad is not under load. The sealing ring 3d on the upper face can be omitted.

The pad of FIGS. 13 to 15 is simple and inexpensive to form, because it can be moulded in one piece, and yet can provide acceptable hardness/sealing characteristics in certain track conditions.

As pads embodying the present invention are provided with sealing means which deform, under the weight of a rail placed upon the pad, so as to form a substantially watertight seal around the peripheral region of the rail-supporting portion of the pad, water carrying sand, grit, or other particles, can be prevented from seeping between the base of the pad and the rail foundation, thereby substantially avoiding the problem of erosion of the rail foundation and/or the pad which might otherwise be caused through such water seepage.

What we claim is:

1. A pad, for providing cushioning between the bottom of a railway rail and a rail foundation on which said rail stands, comprising:
- a first portion composed of cushioning material, which is plate-like in shape and which has a first main face for supporting said rail and a second main face opposite said first main face; and
- resiliently-deformable sealing means, softer than said first main face and located at a peripheral region of said second main face so as to project therefrom, which sealing means are such that, when said pad is placed on said rail foundation and said rail is placed on said first main face, said sealing means contact said rail foundation and deform under the weight of the rail to form a substantially watertight seal, between said rail foundation and said pad, around the periphery thereof.

2. A pad as claimed in claim 1, wherein said first portion comprises first and second layers each having a pair of opposite main faces, a main face of said first layer being bonded to a main face of said second layer such that one of the opposite main faces of said first layer provides said first main face of said first portion and one of the opposite main faces of said second layer provides said second main face of said first portion, the material of said first layer being harder than the material of said second layer.

3. A pad as claimed in claim 2, wherein said sealing means comprise a strip formed integrally with said second layer at said peripheral region of said second main face.

4. A pad as claimed in claim 2, wherein said sealing means comprise a strip bonded to said second layer at said peripheral region of said second main face, said strip being made of a material that is softer than the material of said second layer.

5. A pad as claimed in claim 2, wherein said first and second layers are made of polyurethane materials of different respective hardnesses.

6. A pad as claimed in claim 2, wherein said first and second layers are made of rubber materials of different respective hardnesses.

7. A pad as claimed in claim 2, wherein the hardness of said first layer is in the range from 70 to 90 durometer hardness.

8. A pad as claimed in claim 2, wherein the hardness of said first layer is 80 durometer hardness and the hardness of said second layer is 60 durometer hardness.

9. A pad as claimed in claim 2, wherein the thickness of said first layer is greater than or equal to the thickness of said second layer.

10. A pad as claimed in claim 1, wherein said first portion consists of a first material and said sealing means comprise a layer, consisting of a second material, bonded to said first portion at said second main face thereof and extending over substantially the whole of said second main face.

11. A pad as claimed in claim 10, wherein said first material is a hard polyurethane and said second material is a soft polyurethane.

12. A pad as claimed in claim 10, wherein said first material is of Shore 'A' hardness 90 and said second material is of Shore 'A' hardness 60.

13. A pad as claimed in claim 1, wherein said first portion consists of a first material and said sealing means comprise a strip, consisting of a second material, bonded to said first portion at said peripheral region of said second main face and extending around said peripheral region.

14. A pad as claimed in claim 13, wherein said strip is recessed into said second main face.

15. A pad as claimed in claim 13, wherein said first material is a hard polyurethane and said second material is a soft polyurethane.

16. A pad as claimed in claim 13, wherein said first material is of Shore 'A' hardness 90 and said second material is of Shore 'A' hardness 60.

17. A pad as claimed in claim 1, wherein said sealing means extend to the edges of said second main face and terminate therewith.

18. A pad as claimed in claim 1, wherein said sealing means, when deformed, do not extend beyond the periphery of said first portion.

19. A pad as claimed in claim 1, wherein said first portion is rectangular in shape and has respective additional ear portions, projecting from a pair of opposite edges of said first portion near to the corners of said first portion, said ear portions each being substantially triangular in shape and having surface regions projecting outwardly from said opposite edges, which regions define respective locating recesses, along said opposite edges, between said ear portions.

20. A pad as claimed in claim 1, formed in one piece from polyurethane material of 65 durometer hardness.

21. A pad, for providing cushioning between the bottom of a railway rail and a rail foundation on which said rail stands, comprising:
- a plate-like rail-supporting portion having a first main face for supporting said rail and a second main face opposite said first main face, said rail-supporting portion being formed in one piece from rubber material reinforced with canvas;
- said second main face being contoured to define, at a peripheral region of that face, a sealing strip which, when the pad is placed on said rail foundation and said rail is placed on said first main face, contacts said rail foundation and deforms under the weight of said rail to form a substantially watertight seal, between said rail foundation and the pad, around the periphery of the pad.

22. A pad, for providing cushioning between the bottom of a railway rail and a rail foundation on which said rail stands, comprising:
- a plate-like rail-supporting portion having a first main face for supporting said rail and a second main face opposite said first main face;
- said second main face being contoured to define, at a peripheral region of said second main face, a sealing strip which, when the pad is placed on said rail foundation and said rail is placed on said first main face, contacts said rail foundation and deforms under the weight of said rail to form a substantially watertight seal, between said rail foundation and the pad, around the periphery of the pad; and
- said first main face being also contoured to define a further sealing strip at a peripheral region of said first main face.

* * * * *